United States Patent

[11] 3,566,212

[72] Inventor David Wayne Marx
Redondo Beach, Calif.

[21] Appl. No. 801,462
[22] Filed Feb. 24, 1969
[45] Patented Feb. 23, 1971
[73] Assignee TRW Semiconductors, Inc.
Lawndale, Calif.

[54] HIGH TEMPERATURE SEMICONDUCTOR PACKAGE

21 Claims, 8 Drawing Figs.

[52] U.S. Cl. .......... 317/235, 317/234
[51] Int. Cl. .......... H01l 1/08
[50] Field of Search .......... 317/234, 235, 236, 237, 238, 239, 240, 241, 101

[56] References Cited

UNITED STATES PATENTS

| | | | |
|---|---|---|---|
| 2,937,960 | 5/1960 | Pankove | 317/235X |
| 2,999,964 | 9/1961 | Glickman | 317/234 |
| 3,001,113 | 9/1961 | Mueller | 317/236 |
| 3,257,588 | 6/1966 | Mueller | 317/234 |
| 3,271,625 | 9/1966 | Caracciolo | 317/101 |

*Primary Examiner*—James D. Kallam
*Attorney*—Spensley and Horn

ABSTRACT: A package for a transistor or other semiconductor device wherein a semiconductor crystal is connected to a first thermal conducting ceramic layer and enclosed within a cavity created by a second thermal conducting ceramic layer. Openings in at least one of the thermal conducting ceramic layers are filled with a conductive material, the material making electrical contact with the active regions of the semiconductor device. Metal contacts are connected to the thermal conducting ceramic layer making electrical contact with the conductive material in the openings, and therefore making electrical contact with the active regions of the semiconductor device.

INVENTOR.
DAVID W. MARX,

BY HIS ATTORNEYS
Spensley & Horn.

INVENTOR
DAVID W. MARX,
By His Attorneys
Spensley & Horn

INVENTOR.

DAVID W. MARX,

By His ATTORNEYS.

Spensley & Horn

HIGH TEMPERATURE SEMICONDUCTOR PACKAGE

BACKGROUND OF THE INVENTION

1. Field of the Invention

This invention relates to the field of semiconductor packaging, particularly those semiconductor devices which require high thermal dissipation and protection from destructive ambient conditions.

2. Description of the Prior Art

In the past, packaging for power transistors, or other semiconductor devices requiring high thermal dissipation, used various configurations of sealed metal cans. Use of sealed cans did not fully solve the problem of heat dissipation, and in addition, left other problems unresolved. A problem which is encountered with devices utilizing the prior art is the presence of leaks caused by gas-ambients internal to the can. In addition, since the can was filled with gas or air, the leads were free to expand, contract, and otherwise react to ambient conditions with possible resulting damage to the device, therefore rendering it inoperative.

In the manufacture of power transistors, thermal dissipation properties were a major problem. Using the conventional packages disclosed by the prior art, heat could be dissipated from only a single crystal face since only one face was mounted to a heat-absorbing surface. The absence of a second dissipating surface inhibits efficient operation of the semiconductor device in that high leakage currents or thermal breakdown are typical results.

Another problem which was not solved by the prior art was the destructive results obtained when a conventional semiconductor package was subjected to radiation. When a conventional package was irradiated, the resulting heat was sufficient to melt the typically employed solder connection between the semiconductor crystal and the header, with the result the semiconductor crystal could move thereby causing the device to fail. Where thin gold wires (or other materials with high atomic numbers) were used for internal connections, absorption of x-rays could result in vaporization of the wire with the resulting failure of the device.

An additional problem not solved by the prior art was the absence of strength. The use of cans filled with gas or air leaves the device subject to failure from mechanical shock and vibration. As a collateral problem in the case of transistors, the use of thin leads for interconnections increased the base, emitter, and collector resistances.

BRIEF SUMMARY OF THE INVENTION

It is an object of the present invention to provide a semiconductor package which will withstand mechanical shock.

It is another object of the present invention to provide a semiconductor package which will provide a hermetic seal around a semiconductor device enabling the combination of the semiconductor crystal and the package therefore to withstand radiation damage.

It is yet another object of the present invention to provide a package for a power transistor which will have improved thermal dissipation properties.

It is still yet another object of the present invention to provide a semiconductor package which efficiently dissipates heat from two surfaces.

It is an additional object of the present invention to provide a power transistor package with external contacts which also serve as heat dissipation surfaces.

The present invention utilizes a thermal conducting ceramic (preferrably $BeO$ or $Al_2O_3$) as passivating layers, the purpose of which are to encapsulate the semiconductor crystal and provide for heat dissipation from the semiconductor device. In the case of transistors, the semiconductor device can be of either the planar or mesa types. The thermal conducting ceramic layers are typically in sheet form which are machined to the proper dimensions, but the layers could be obtained by conventional deposition techniques. Although the ceramic is herein described as a layer, it is understood that the term substrate is equally applicable.

The semiconductor device is connected to a conductive layer which is on the top surface of a first passivating layer. The semiconductor device is enclosed with a cavity created by a second passivating layer when the second passivating layer is connected to the first passivating layer. Slots or holes in the second passivating layer give access to the top surface of the semiconductor device. In one configuration of the present invention, access to the top surface of the semiconductor device would be to the emitter and base regions of a transistor crystal. When the top surface of the first passivating layer is plated or otherwise covered with a conductive layer, typically gold, this will give access to the collector region of a transistor crystal. The holes or slots in the second passivating layer are filled with a conductive material which will make contact with the active regions of the semiconductor crystal. Metal contacts, typically with square, rectangular, round, or any other geometry are bonded, brazed, or otherwise connected by conventional methods to the top surface of the second passivating layer making contact with the particular paths of conductive material. By connecting contacts to the semiconductor device at the top and bottom of the device, heat is dissipated by two surfaces instead of one as in the above-mentioned conventional packaging.

The use of the conductive geometrical contacts in combination with the conductive material in the slots provided in the passivating layer, in place of wire leads, will reduce the base, emitter, and collector resistances of a transistor. In addition, the structure of the contacts in combination with the passivating layers also adds to the mechanical strength of the package. It is understood that any discussion of the transistor with its three active regions is only for the purpose of example, and therefor the present invention will be equally applicable to a semiconductor device irrespective of the number of active regions.

By enveloping the semiconductor device, the package is able to withstand the effect of radiation. The semiconductor device is enclosed between the passivating layers and the leads, therefore even if the ambient temperature exceeds the melting point of the conductive material in the slots, the semiconductor device cannot move and as a result the device will remain operative.

BRIEF DESCRIPTION OF THE DRAWINGS

The novel features which are believed to be characteristic of the invention, both as to its organization and method of operation, will be better understood from the following description considered in connection with the accompanying drawing in which presently preferred embodiments of the invention are illustrated by way of example. In the drawing.

DESCRIPTION OF THE PRESENTLY PREFERRED EMBODIMENTS

Figure 1:
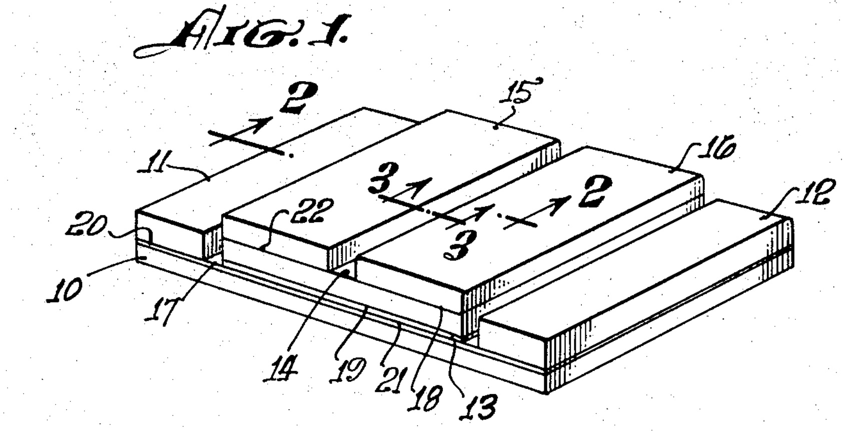
FIG. 1 is a perspective view of a semiconductor package made in accordance with a presently preferred embodiment of the invention.
Figure 2:
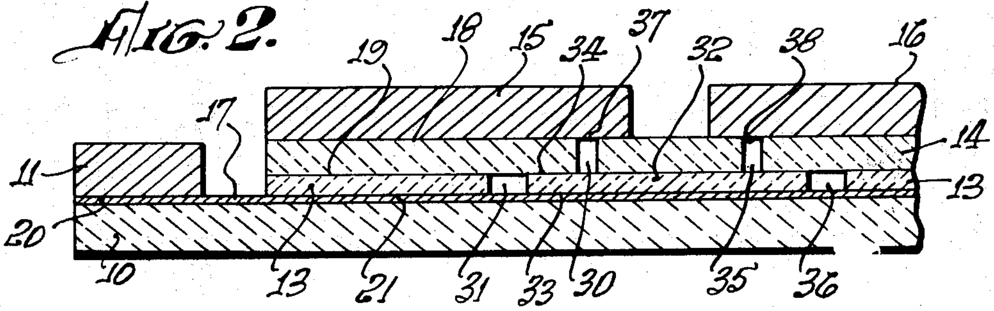
FIG. 2 is an enlarged cross section taken along lines 2–2 of FIG. 1.
Figure 3:
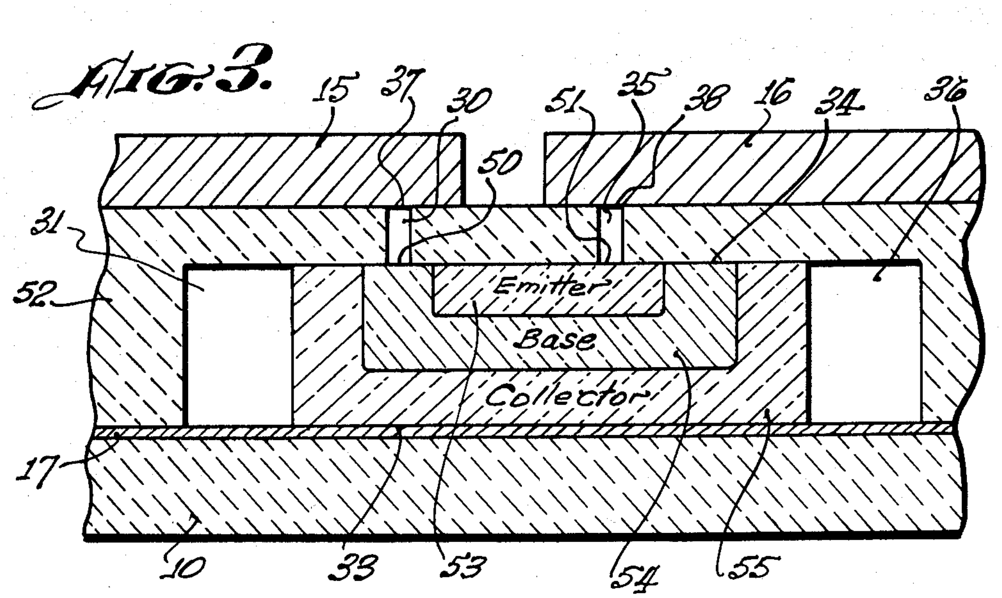
FIG. 3 is an enlarged cross section taken along lines 3–3 of FIG. 1.

Due to the interrelationship between FIGS. 1, 2, and 3, the three FIGS. will be discussed together with like parts having the same reference numbers. With reference to FIGS. 1, 2, and 3, there is shown a presently preferred embodiment of the present invention semiconductor package. A first passivating member 10 is plated or otherwise covered with an electrically conductive layer 17, the conductive layer 17 being preferably gold. The first passivating member 10 and those passivating members described hereinbelow can be equally defined as layers, the terms being understood to be synonimous. The first passivating layer 10 is a thermal conducting ceramic material, preferably BeO or $Al_2O_3$. BeO has better thermal dissipation properties and therefore is better adapted for devices requiring high heat dissipation, but care must be taken in handling BeO. BeO can be hazardous to the human respiratory system when it is in powder form, therefore if the BeO portions are to be machined or ground, care should be taken to have the proper equipment.

Referring to FIG. 2, a transistor crystal 32 is bonded or otherwise connected to the conductive layer 17 on the top surface of the first passivating layer 10. The transistor crystal 32 can be enclosed within the thermal conducting ceramic members by two alternative methods. In FIG. 2 a second passivating layer 14 is soldered or otherwise connected to the top surface of the transistor crystal 32. A third passivating layer 13 is therein shown to surround and therefore fully enclose the transistor crystal 32 by being connected to the second passivating layer 14 at surface 19 and to the conductive layer 17 at surface 21. FIG. 3 shows the alternative method whereby a second passivating layer 52 is in the form of a cap thereby creating a cavity and fully enclosing the transistor crystal 32 by a single thermal conducting ceramic layer. Another alternative would be to merely substitute a thermal conductive material for the third passivating layer 13.

Metal contacts 15 and 16, preferably copper or aluminum, are connected to the top surface 18 of the second passivating layer 14. As will be seen from FIG. 3, metal contact 15 is the base contact and metal contact 16 is the emitter contact of a transistor device. FIG. 3 illustrates an alternative form for the second passivating layer 52 upon which the metal contacts 15 and 16 are connected. Metal contacts 11 and 12 are connected to the conductive layer 17 on the top surface of the first passivating layer 10, the connection made at surface 20. As seen from FIG. 1, metal contacts 11 and 12 are both collector contacts, both being preferably copper or aluminum.

The details of the connection to the transistor are best seen by reference to FIG. 3. The second passivating layer 14 (or 52 if the cap alternative is used) has slots or holes 30 and 35 giving access to the top surface 34 of the transistor crystal 32. The slots 30 and 35 are filled with a conductive material. As an example, the conductive material is typically a solder, binary eutectic, or a metal deposited by vaporization techniques. Slot 30 is positioned so that the conductive material is electrically connected to the base region 54 at surface 50. Slot 35 is positioned so that the conductive material is electrically connected to the emitter region 53 at surface 51. The metal contacts 15 and 16 are brazed or otherwise connected to the second passivating layer 14 (52 if the cap alternative is used) so that they make contact with the conducive material filling slots 30 and 35 at surfaces 37 and 38 respectively. Metal contact 15 is electrically connected to the base region 54 and metal contact 16 is connected to the emitter region 53. The surface 34 created by the connection of the transistor crystal 32 and the second passivating layer 14 (or 52) is a thermal dissipation path.

The collector region 55 is soldered or otherwise connected to the conductive layer 17 at surface 33. Referring to FIG. 1 and FIG. 2, metal contacts 11 and 12 are connected to the conductive layer 17 at surface 20 with the resulting electrical connection to the collector region 55. The volume 31 and 36 between the transistor crystal 32 and the cavity formed by the second passivating layer 14 and the third passivating layer 13 (or 52 if the cap alternative is used) can be filled with a polyimide or other like substances. In this configuration, the material is to prevent movement of the transistor crystal 32, and therefore the properties of the material used are not important.

The reduction in base, emitter, and collector resistance is derived from the increase in volume of the interconnecting leads. Resistance can be found from the relationship:

$$R=r\frac{L}{A}$$

where ($L$) equals length of the lead, ($A$) equals the area of the lead, and $r$ equals the resistivity. The wire lead in a standard transistor package is approximately 75 mils in length and 2 mils in diameter. In this configuration, the length can be considered the same, but the cross-sectional area is much larger since the conductive path is formed within the slot 30 or 35. A typical slot width is 10 mils. The collector resistance is reduced because of the conductive layer 17. Typical values for this configuration are:

$R_{collector}=1.84\times 1^{-3}$ ohms
$R_{base\ or\ emitter}=2.68\times 10^{-5}$ ohms The thermal dissipation properties are also improved because the transistor crystal 32 is connected to heat absorbing material at both the top and bottom surfaces. In the prior art, the crystal is typically connected to a heat-absorbing material at only one crystal surface, therefore heat at the semiconductor junctions could be dissipated only by the single surface. In FIG. 3, the conductive layer 17 and the first passivating layer 10 serve as a second thermal dissipating path. For the configuration shown in FIG. 3, the thermal resistivity is equal to 0.22° Centigrade per watt.

Because of the structure of the present invention combination, the overall strength characteristics are improved. The present invention combination provides for no air space between the transistor crystal 32 and the surrounding passivating layers 10, 13, and 14 (or 52). In the event the package is subject to temperatures exceeding the melting point of the conductive material in slots 30 and 35, the transistor crystal will be held in place because of the structure. As a result, the transistor crystal 32 cannot move and therefore will not be rendered inoperable because of movement. By creating a solid package, higher mechanical stresses can be tolerated. High mechanical vibration, shock, and shearing forces would generally destroy a conventional semiconductor package, whereas the present invention solid package is an improvement. The use of the solid package also allows the use of thinner passivating layers 10, 13, and 14, (or 52) therefore the thermal dissipating properties will also be improved.

The problem of radiation damage is solved by the use of slots 30 and 35. When the slots 30 and 35 are filled with a conductive material, the connection between the metal contacts 15 and 16 and the transistor crystal 32 is secure even when the package is subject to radiation. The thin wire leads, used in the prior art to make a connection to a semiconductor device, could be vaporized when irradiated. The solid package presented by the present invention combination prevents destruction of the device. The conductive material in slots 30 and 35 may melt when the ambient temperature exceeds its melting point, but the connection between the transistor crystal 32 and metal contacts 15 and 16 will not be broken.

Figure 4:
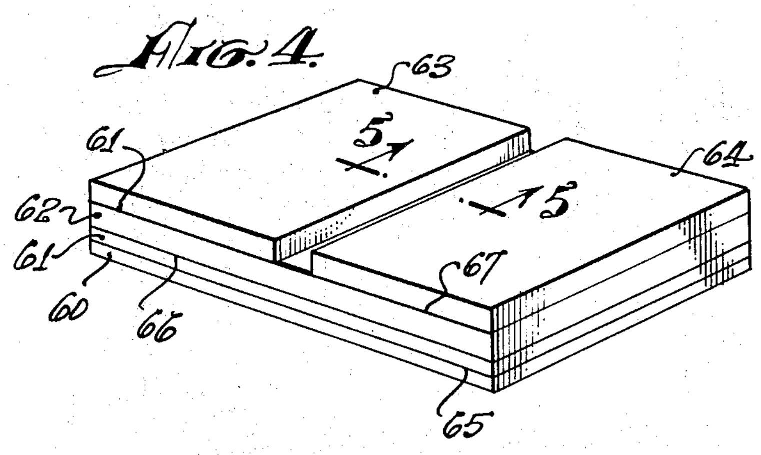
FIG. 4 is a perspective view of another preferred embodiment of the present invention.
Figure 5:
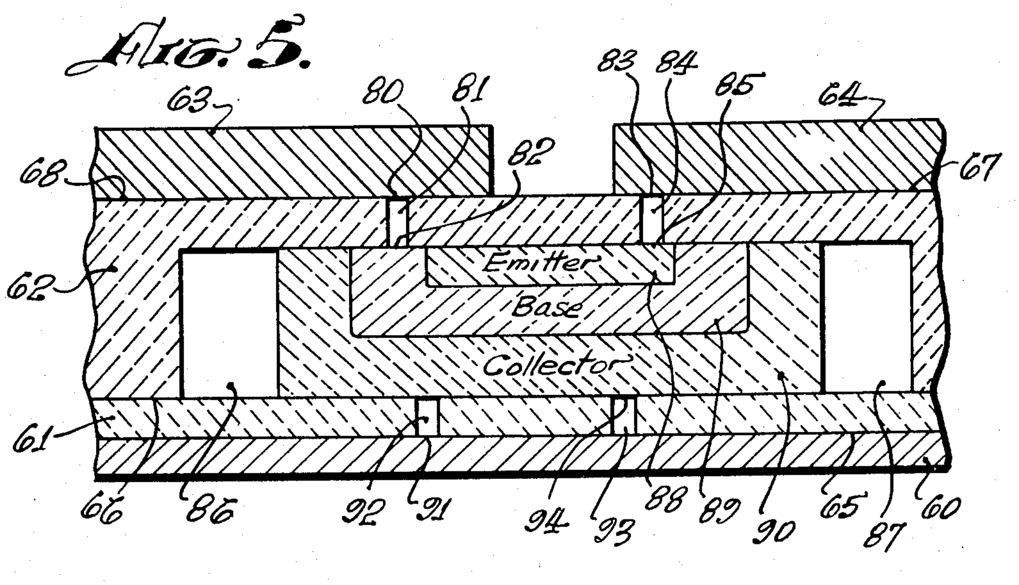
FIG. 5 is an enlarged cross section taken along lines 5–5 of FIG. 4.

Due to the relationship between FIGS. 4 and 5, the two FIGS. will be discussed together with like parts having the same reference numbers. Another embodiment of the present invention combination is shown in FIG. 4. In this embodiment of the present invention, a metal contact 60 is brazed or otherwise connected to a first passivating layer 61 at surface 65, the first passivating layer 61 having slots 92 and 93 giving access to the bottom surface of the semiconductor device. In this case, as shown in FIG. 5, slots 92 and 93 give access to the collector region 90 of the transistor crystal. When the slots 92 and 93 are filled with a conductive material, the collector contact 60 will be in electrical contact with the collector region 90 of the transistor crystal, the contact made at surfaces 91 and 94. The collector contact 60 can encompass the entire area of the bottom surface of the first passivating layer 61 or just cover the conducting slots 92 and 93; the application will dictate the shape of the collector contact 60 and the area of the first passivating layer 61 which is covered. The first passivating layer 61 is preferably BeO or $Al_2O_3$, the former to be used where high thermal dissipation properties are desired. The collector contact 60 is preferably copper or aluminum.

The first passivating layer 61 is connected to a second passivating layer 62 at surface 66 by solder or other conventional connecting methods. The second passivating layer 62 is preferably BeO or $Al_2O_3$. Metal contacts 63 and 64 are connected to the second passivating layer 62 at surfaces 68 and 67 respectively, the contacts being preferably copper or aluminum.

Referring now to FIG. 5, a detailed cross section of the embodiment shown in FIG. 4 is shown. The base region 89 is electrically connected to metal contact 63 via a conductive material filling slot 81, the connection made at surfaces 80 and 82. The emitter region 88 is electrically connected to metal contact 64 via the conductive material filling slot 84, the connection made at surfaces 83 and 85. As in the embodiment shown in FIG. 3, the base and emitter connections are made via slots 81 and 84 which are filled with the conductive material. The embodiment shown in FIG. 5 differs from that shown in FIG. 3 in that the collector contact 60 of the former is the bottom surface of the package whereas the collector contacts 11 and 12 of the latter requires a conductive layer 17 on the top surface of the first passivating layer 10.

The configuration shown in FIG. 5 utilizes a second passivating layer 62 shaped to form a cavity and therefore fully enclose the semiconductor device. An alternative method would utilize two passivating layers similar to that shown in FIG. 2. The space 86 and 87 surrounding the collector region 90 and encompassed by the first and second passivating layers 61 and 62 will be filled to prevent movement of the semiconductor crystal. The material filling the volume designated as space 86 and 87 can be a polyimide or other conventional, like materials. Because the collector region 90 is in contact with the nonconducting passivating layers 61 and 62, the properties of the material are unimportant in this configuration.

Figure 6:
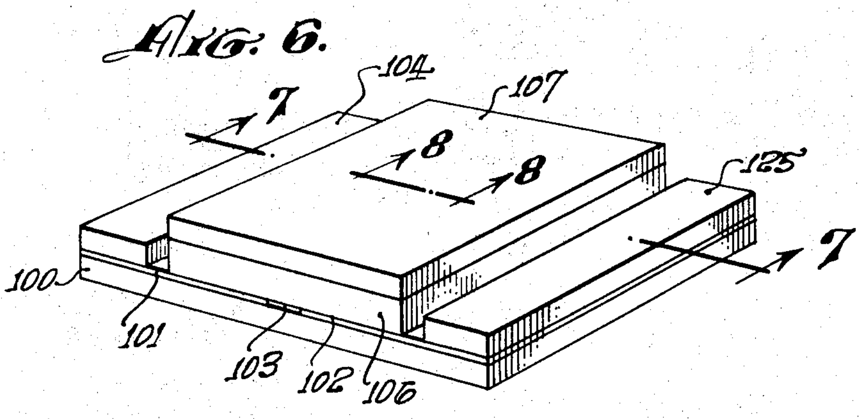
FIG. 6 is a perspective view showing another embodiment of the present invention.

Due to the interrelationship between FIGS. 6, 7, and 8, the three FIGS. will be discussed together with like parts having the same reference numbers. Another embodiment of the present invention combination is shown in FIG. 6. Although the external appearance of the package is approximately the same as shown in FIG. 1, in this embodiment the position of the transistor crystal 120 has been reversed thereby reversing the contact designation and the form of the conducting layers 101 and 102 on the top surface of the first passivating layer 100. The reversal of the transistor crystal 120 cannot be seen from FIG. 6 but can be seen in FIG. 8. As is shown in FIG. 6, the conductive layer is divided into two conductive layers 101 and 102 and they are connected to the top surface of the first passivating layer 100, leaving a nonconductive region 103. The conductive layers 101 and 102 are preferably gold. Metal contacts 104 and 105 are brazed or otherwise connected to the conductive layers 101 and 102 respectively, but as can be seen from FIG. 7 and FIG. 8, metal contact 104 is the emitter contact and metal contact 105 is therefore the base contact.

Using the cap alternative, a second passivating layer 106 is connected to the conductive layer 101 and 102 and the nonconductive region 103 thereby fully enclosing the transistor crystal 120. Metal contact 107 is connected to the top surface of said second passivating layer 106. Metal contacts 104, 105, and 107 are preferably copper or aluminum. The passivating layers 100 and 106 are preferably BeO or $Al_2O_3$, the former to be used if high thermal dissipation properties are needed.

Figure 7:
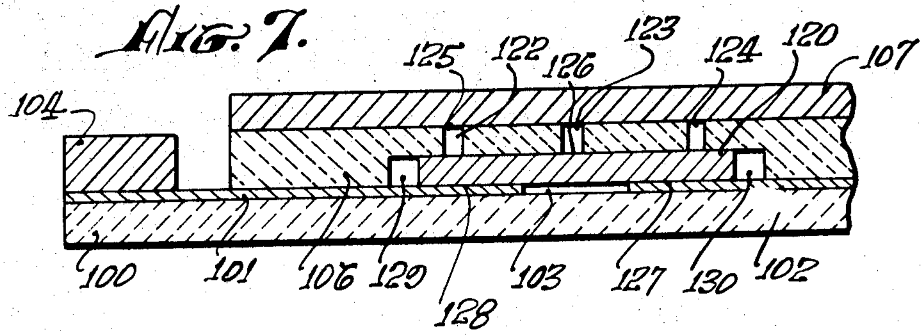
FIG. 7 is an enlarged cross section taken along the lines 7–7 of FIG. 6.
Figure 8:
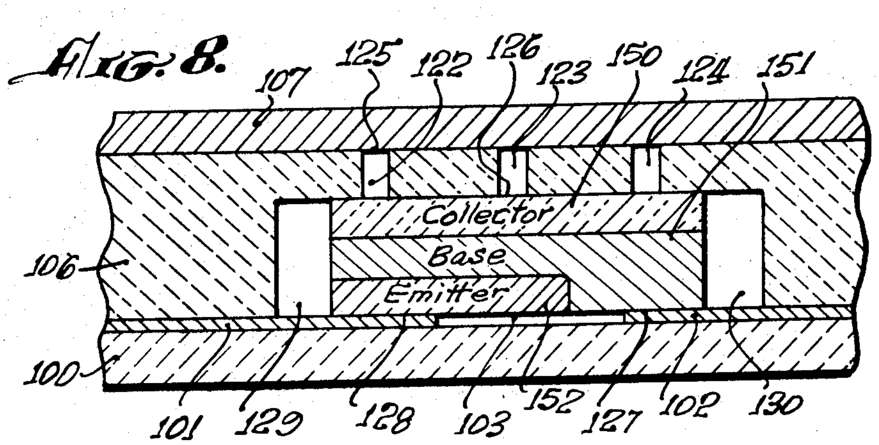
FIG. 8 is an enlarged cross section taken along lines 8–8 of FIG. 6.

The manner by which this embodiment of the present invention combination differs with those illustrated in FIGS. 1—5 can best be seen in FIG. 7 and FIG. 8. The transistor crystal 120 is connected to the first passivating layer 100 so that the emitter region 152 is in electrical contact with a conducting layer 101 at surface 128 and the base region 151 is in electrical contact with the conducting layer 102 at surface 127. Metal contacts 104 and 105 are connected to conducting layers 101 and 102 respectively, thereby making electrical contact with the emitter and base regions of the transistor crystal 120. By comparing the embodiment of the present invention combination shown in FIG. 8 with those in FIG. 3 and FIG. 5, it can be seen that the orientation of the transistor crystal 120 has been reversed.

A second passivating layer 106 is connected to the top surface of the transistor crystal 120, the conducting layers 101 and 102, and the nonconducting region 103. The second passivating layer 106 has slots 122, 123, and 124 for access to the collector region 150 of the transistor crystal 120. The slots 122, 123, and 124 are filled with a conductive material, the conductive material making electrical contact with the collector region 150. The conductive material is the same as that described above. A metal contact 107 is connected to top surface of the second passivating layer 106, the metal contact 107 making electrical contact with the collector region 150 of the transistor crystal 120 via the conductive material-filling slots 122, 123, and 124, the contact made at surfaces 125 and 126. The volume 129 and 130 created by enclosing the transistor crystal 120 within the first and second passivating layers 100 and 106, will be filled with a nonconducting polyimide or other material which will prevent the transistor crystal 120 from moving. As distinguished from the configurations shown in FIGS. 1—5 the material in the space 129 and 130 must be a nonconducting material because of the transistor crystal 120 configuration.

Although the embodiment shown in FIG. 6 illustrates a collector contact 107 covering only the surface of the second passivating layer 106, the collector contact 107 could be enlarged to provide an increased heat-sinking surface as well as a mechanical-coupling surface. The configuration provides for increased thermal dissipation, increased strength, reduced base, emitter, and collector resistance, and improved operation in an ambient irradiated environment. Improved thermal properties arise out of the connection of the transistor crystal 120 to two heat-dissipating surfaces. The typical figure for thermal resistivity is 0.169° Centigrade per watt. Improved strength is achieved by the solid package which has little or nor enclosed air space. Since the wire leads used in conventional devices are replaced by the conductive material filling slots 122, 123 and 124 and the solid metal contacts 104, 105, and 107, the contact resistances are as follows:

$R_{base} = R_{emitter} = 2.94 \times 10^{-3}$ ohms $R_{collector} = 1.45 \times 10^{-6}$ ohms The replacement of wire leads by the solid contact surfaces prevents destruction of the leads in an irradiated environment. In addition, since the transistor crystal 120 is fully enclosed, even if the melting point of the conductive material in the slots 122, 123, and 124 is reached, the transistor crystal 120 cannot move, therefore the device will remain operative.

The embodiments shown in FIGS. 1 through 8 could be altered by changing the dimensions of the second passivating layers 52, 62, and 106. With reference to FIG. 3, the second passivating layer 52 could be dimensioned to make contact with the side surfaces of the transistor chip 32 thereby preventing movement of the transistor chip 32, eliminating areas 31 and 36, and eliminating the necessity of using a polyimide or other like substance. The same principle can be employed to change the dimensions of the second passivating layers 62 and 106, the change producing the same results.

As will be apparent to one skilled in the art, many changes may be made to the present invention combination which are within the spirit and scope of this invention. Therefore, the only limitations placed on the scope of the invention are those limitations recited in the claims below.

I claim:

1. A combination of a semiconductor device and package therefor comprising:

a. a first thermally conducting ceramic layer having an electrically conductive layer on a surface thereof;

b. a second thermally conducting ceramic layer spaced from said first ceramic layer and a sidewall connected to said second ceramic layer and to said electrically conductive layer on said first thermally conducting layer creating a closed cavity between said first and second thermally conducting layers;
c. a semiconductor wafer disposed within said cavity created by said first and second thermally conducting ceramic layers and connected to said electrically conductive layer on said first thermally conducting layer and to said second thermally conducting layers;
d. an opening through said second thermally conducting layer, said opening being filled with an electrically conductive material in electrical contact with said semiconductive wafer;
e. a metal contact connected to said second thermally conductive layer, said metal contact contacting said electrically conductive material filling the opening in said second thermally conducting layer; and
f. at least one metal contact connected to said conductive layer on said first thermally conducting layer.

2. A combination of a semiconductor device and package therefor comprising:
a. first and second thermally conducting ceramic members connected together and forming a closed cavity within said connected members;
b. a semiconductor wafer disposed within said cavity and in contact with said first and second thermally conducting members;
c. an opening through each of said first and second thermally conducting members, said openings being filled with an electrically conductive material, said electrically conductive material being in electrical contact respectively with said semiconductor wafer; and
d. a metal contact connected to each of said first and second thermally conducting ceramic members said contacts contacting respectively said electrically conductive material in the openings in said first and second thermally conducting members.

3. A combination of semiconductor device and package therefor comprising:
a. a semiconductor wafer having top, bottom, and side surfaces;
b. a first passivating member having top, bottom, and side surfaces the top surface of which is connected to an electrically conductive layer for making an electrical connection;
c. means for connecting the bottom surface of said semiconductor wafer to said electrically conductive layer on said top surface of said first passivating member;
d. a second passivating member having top, bottom, and side surfaces a first predetermined area of the bottom surface of which is connected to said top surface of said semiconductor wafer, said second passivating member having an opening from the top to the bottom surface thereof, said opening giving access to predetermined areas on the top surface of said semiconductor wafer, and electrically conductive material being disposed within said opening and electrically contacting the top surface of said semiconductor wafer;
e. thermally conducting, electrically inert means connected to a second predetermined area of the bottom surface of said second passivating member, to said electrically conductive layer on the top surface of said first passivating member and to the side surfaces of said semiconductor wafer, said means for enclosing said semiconductor wafer;
f. a metal contact connected to the top surface of said second passivating member, said metal contact contacting said electrically conductive material disposed within said opening in said second passivating member, and
g. at least one metal contact connected to said electrically conductive layer on said top surface of said first passivating member.

4. A combination of a semiconductor device and package therefor comprising:
a. a semiconductor wafer having top, bottom, and side surfaces;
b. a first passivating member having top, bottom and side surfaces, the top surface of which is connected to an electrically conductive layer for making an electrical connection;
c. means for connecting the bottom surface of said semiconductor wafer to said electrically conductive layer on said top surface of said first passivating member;
d. a second passivating member having top, bottom, and side surfaces, a predetermined area of the bottom surface of which is connected to said top surface of said semiconductor wafer, said second passivating member having an opening from the top to the bottom surface thereof, said opening giving access to predetermined areas on the top surface of said semiconductor wafer, and electrically conductive material being disposed within said opening in said second passivating member and contacting the top surface of said semiconductor wafer; passivating
e. means for connecting a second predetermined area of the bottom surface of said second passivating layer to the top surface of said first passivating member;
f. a metal contact connected to the top surface of said second passivating member, said metal contact contacting said electrically conductive material disposed within said opening in said second passivating member; and
g. at least one metal contact coupled to said electrically conductive layer on said top surface of said first passivating member.

5. The combination as defined in claim 4 in which said first and second passivating members are BeO.

6. The combination as defined in claim 4 wherein said metal contacts are aluminum.

7. The combination as defined in claim 4 wherein said metal contacts extend beyond the side surfaces of said passivating member and serve as external connecting surfaces.

8. The combination as defined in claim 4 wherein said means for coupling said second passivating member to said first passivating member is a third passivating member having a top, bottom, and side surfaces with an opening from the top to the bottom surface, said opening dimensionally larger than said semiconductor wafer, the top surface of which is coupled to the bottom surface of said second passivating member and the bottom surface of which is coupled to the electrically conductive layer on the top surface of said first passivating member.

9. The combination as defined in claim 8 wherein said third passivating member is BeO.

10. The combination of a semiconductor device and a package therefor comprising:
a. a semiconductor wafer having top, bottom and side surfaces;
b. a first passivating member having top, bottom, and side surfaces, the top surface of which is connected to the bottom surface of said semiconductor wafer, said first passivating member having at least one opening from the top to the bottom surface for access to predetermined areas of the bottom surface of said semiconductor wafer, said openings being filled with an electrically conductive material, said electrically conductive material contacting the bottom surface of said semiconductor wafer;
c. a metal contact connected to the bottom surface of said first passivating member, said contact contacting said electrically conductive material in said openings in said first passivating member;
d. a second passivating member having top, bottom, and side surfaces, a predetermined area of the bottom surface of which is connected to the top surface of said semiconductor wafer said second passivating member having a plurality of openings from the top to the bottom surface, said openings giving access to predetermined areas on the top surface of said semiconductor wafer and electrically conductive material in said plurality of openings in said second passivating member and contacting the top surface of said semiconductor wafer;

e. means for coupling a second predetermined area of the bottom surface of said second passivating member to the top surface of said first passivating member; and f. a plurality of metal contacts connected to the top surface of said second passivating member, each of said plurality of metal contacts contacting the electrically conductive material in a predetermined number of the plurality of openings in said second passivating member.

11. The combination as defined in claim 10 wherein said metal contact connected to the bottom surface of said first passivating member extends beyond the side surfaces of said first passivating member and serves as an external connecting surface.

12. The combination as defined in claim 10 wherein said metal contacts are aluminum.

13. The combination as defined in claim 10 in which said first and second passivating members are BeO.

14. The combination as defined in claim 10 wherein said means for connecting said second passivating member to said first passivating member is a third passivating member having a top, bottom, and side surfaces with an opening from the top to the bottom surface, said opening dimensionally larger than said semiconductor wafer, the top surface of which is connected to the bottom surface of said second passivating member and the bottom surface of which is connected to the top surface of said first passivating member.

15. The combination as defined in claim 14 wherein said third passivating member is BeO.

16. A combination of a semiconductor device and the package therefor comprising:

a. a semiconductor wafer having top, bottom and side surfaces;

b. a first passivating member having top, bottom, and side surfaces, the top surface of which having at least three predetermined areas at least two of which are connected to a first and second electrically conductive layer respectively;

c. means for connecting predetermined areas on the bottom surface of said semiconductor wafer to a predetermined one of said first and second electrically conductive layers respectively on the top surface of said first passivating member;

d. a second passivating member having top, bottom, and side surfaces, a first predetermined area of the bottom surface of which is connected to the top surface of said semiconductor wafer, said second passivating member having an opening from the top to the bottom surface, said opening being filled with electrically conductive material, and said electrically conductive material contacting a predetermined area on the top surface of said semiconductor wafer;

e. means for connecting a second predetermined area of the bottom surface of said second passivating member to the first and second electrically conductive layers respectively on the top surface of said first passivating member;

f. a metal contact connected to the top surface of said second passivating member said metal contact contacting the electrically conductive material in the opening in said second passivating member; and g. a metal contact connected to each of said first and second conductive layers on the top surface of said first passivating member.

17. The combination as defined in claim 16 wherein said first and second passivating members are BeO.

18. The combination as defined in claim 16 in which the metal contact coupled to the top surface of said second passivating member extends beyond the side surfaces of said second passivating member and serves as an external connecting surface.

19. The combination as defined in claim 16 wherein said metal contacts are aluminum.

20. The combination as defined in claim 16 wherein said means for connecting said second passivating member to said first passivating member is a third passivating member having top, bottom, and side surfaces, with an opening from the top to the bottom surface, said opening dimensionally larger than said semiconductor wafer, the top surface of which is connected to the bottom surface of said second passivating member and the bottom surface of which is connected to the three predetermined areas on the top surface of said first passivating member.

21. The combination as defined in claim 20 wherein said third passivating member is BeO.